US009240272B2

(12) United States Patent
Valentin

(10) Patent No.: US 9,240,272 B2
(45) Date of Patent: Jan. 19, 2016

(54) WINDING AND METHOD FOR PREPARING A WINDING APPLIED TO AN INDUCTIVE DEVICE

(71) Applicant: MONTAGE TECHNOLOGY (SHANGHAI) CO., LTD., Shanghai (CN)

(72) Inventor: Raphael Valentin, Shanghai (CN)

(73) Assignee: MONTAGE TECHNOLOGY (SHANGHAI) CO., LTD., Shanghai (CN)

(*) Notice: Subject to any disclaimer, the term of this patent is extended or adjusted under 35 U.S.C. 154(b) by 38 days.

(21) Appl. No.: 14/067,468

(22) Filed: Oct. 30, 2013

(65) Prior Publication Data
US 2015/0091687 A1 Apr. 2, 2015

(30) Foreign Application Priority Data
Sep. 29, 2013 (CN) .......................... 2013 1 0460042

(51) Int. Cl.
*H01F 5/00* (2006.01)
*H01F 27/28* (2006.01)
*H01L 21/00* (2006.01)
*H01F 7/06* (2006.01)
*H01F 41/04* (2006.01)
*H01L 49/02* (2006.01)
*H01L 23/522* (2006.01)

(52) U.S. Cl.
CPC .......... *H01F 27/2804* (2013.01); *H01F 41/041* (2013.01); *H01L 23/5227* (2013.01); *H01L 28/10* (2013.01); *H01F 2027/2809* (2013.01); *H01L 2924/0002* (2013.01)

(58) Field of Classification Search
CPC ... H01F 27/2804; H01F 27/29; H01F 41/041; H01F 2027/2809; H01F 5/003; H01L 28/10; H01L 23/5227; H01L 2924/0002; H01L 2924/00
USPC .......................... 336/200, 223; 438/3; 29/605
See application file for complete search history.

(56) References Cited

U.S. PATENT DOCUMENTS

| 5,420,558 | A * | 5/1995 | Ito et al. ........................ 336/200 |
| 6,380,835 | B1 | 4/2002 | Lee |
| 6,870,457 | B2 | 3/2005 | Chen et al. |
| 6,967,555 | B2 | 11/2005 | Yu et al. |
| 7,091,814 | B2 | 8/2006 | Kyriazidou |
| 7,253,712 | B1 | 8/2007 | Papananos |

(Continued)

FOREIGN PATENT DOCUMENTS

CN 1241794 A 1/2000

*Primary Examiner* — Mangtin Lian
(74) *Attorney, Agent, or Firm* — Oliff PLC

(57) ABSTRACT

The present invention relates to a winding and a method for preparing a winding of inductive devices. The winding includes at least a plurality of layers, where each layer includes at least one conductive loop; the conductive loops are electrically connected to form a winding; and the conductive loop or the portion of the conductive loop of at least one layer is not spatially aligned with the conductive loop or the portion of the conductive loop of at least one another layer. The winding may be prepared by adopting a PCB process or semiconductor process, which can effectively consume less of surface area on the integration substrate, have a symmetric trace and reduce the parasitic coupling capacitance while acquiring a high Q-factor value. The windings of the present invention may be used for making an inductor or a transformer.

24 Claims, 8 Drawing Sheets

(56) References Cited

U.S. PATENT DOCUMENTS

| | | |
|---|---|---|
| 7,768,372 B2 | 8/2010 | Gianesello |
| 7,986,210 B2 | 7/2011 | Gianesello |
| 8,198,970 B2 | 6/2012 | Choi et al. |
| 8,258,192 B2 | 9/2012 | Wu et al. |
| 8,325,001 B2 | 12/2012 | Huang et al. |
| 2011/0133878 A1* | 6/2011 | Chiu et al. .............. 336/200 |
| 2012/0274434 A1 | 11/2012 | Lim et al. |
| 2013/0026846 A1 | 1/2013 | Gianesello et al. |

* cited by examiner

WINDING AND METHOD FOR PREPARING A WINDING APPLIED TO AN INDUCTIVE DEVICE

BACKGROUND OF THE PRESENT INVENTION

1. Field of Invention

The present invention relates to the technical field of electronic devices, specifically to a winding and a method for preparing a winding applied to an inductive device.

2. Description of Related Arts

An inductor or a transformer is a common device in an electronic circuit, and the inductor and the transformer both comprise a winding of electrical wire. Along with development of the integrated circuit technology, the inductive devices are generally prepared by adopting one conductive layer or a plurality of conductive layers. Because a winding using one conductive layer ordinarily occupies a large chip area, a winding using the plurality of conductive layers can be applied in designing an inductive device. However, inductive devices based on a winding using the plurality of conductive layers reveal some critical shortcomings with regards to the self-resonance frequency and the Q-factor.

For example, in a China patent application No. 99110933.3, an inductor device and a preparation method thereof are provided, where in the inductor device, each layer of conductive unit is U-shaped, and two adjacent layers of U-shaped loops are disposed oppositely, so as to form a conductive loop spatially through connection.

Moreover, many US patents such as U.S. Pat. Nos. 6,380,835, 6,870,457, 6,967,555, 7,091,814, No. 2011/0133878, U.S. Pat. Nos. 8,325,001, 8,258,192, 7,253,712, No. 2013/0026846, U.S. Pat. No. 8,198,970, No. 2012/0274434, U.S. Pat. Nos. 7,986,210, and 7,768,372 respectively disclose various structures of symmetrical stacked inductors or transformers.

In view of the above, the various symmetrical stacked inductor or transformer winding includes a plurality of conductive loops or conductive half-loops forming a symmetrical and geometrical shape in a single conductive layer or multi layers. In the multi-layer structure, each layer generally includes at least one loop or one half loop. Generally, the plurality of loops is electrically connected by adopting crossover bridges.

However, no matter in the single layer structure or in the multi-layer structure, the geometric centers of loops are spatially coincident and the adjacent loop lines overlap, thereby may affecting the performance of the inductor and transformer such as the self-resonance frequency and the Q-factor.

SUMMARY OF THE PRESENT INVENTION

In view of the defects of the prior art, an object of the present invention is to provide a winding used for making an inductive device such as an inductor or a transformer featuring a symmetric trace, a high Q-factor value and occupying a small surface area.

In order to accomplish the above and other relevant objects, a winding provided in the present invention at least comprises:

a plurality of layers, wherein layers comprises at least one conductive loop; the conductive loops are electrically connected to form a winding; and the geometric center of a conductive loop or a loop section of at least one layer is not spatially aligned with the geometric center of a conductive loop or a loop section of at least one of another layer.

Preferably, when the conductive loops are in a nested manner of two adjacent layers, whose the geometric center of a conductive loop or a loop section is not spatially aligned with another one, the distance between the orthogonal projection of the geometric center of one layer's conductive loop to the an adjacent layer and the geometric center of one loop of the same adjacent layer is 0.5×(W+S), where W is the width of a single conductive loop, and S is the spacing between two adjacent conductive loops which are in a nested manner of the same layer.

Preferably, except for the conductive loop that includes a center tap, the other conductive loops are respectively divided into 2N loop sections along the respective symmetry axis of each conductive loop, and each loop section is electrically connected to another loop section through a cross bridge or an inter-connection that is a pair of crossover conductive via plugs, so as to form N windings, wherein N is an integer greater than or equal to 1; more preferably, the terminal electrodes of each winding are symmetrically adjacent located in two adjacent loop sections of a same conductive loop; and more preferably, terminal electrodes of all windings are belong to the same conductive loop.

Preferably, the conductive loops of a same layer which are in a nested manner are electrically connected with each other through cross bridges; the conductive loops of one layer are electrically connected to other loops of another layer through a pair of crossover conductive via plugs.

Preferably, the widths of different loop sections in the same conductive loop are not completely uniform along the loop.

Preferably, the conductive loop is in a geometric shape having at least one axis of symmetry, such as, regular polygon, oval, or circle or a simple closed curve; more preferably, each conductive loop is divided along the axis of symmetry.

More preferably, the width of a pair of crossover conductive via plugs does not exceed the width of the conductive loop.

A method for preparing a winding further provided in the present invention at least comprises:

forming the winding on a substrate, wherein, conductive loops are isolated with one another through a dielectric material.

Preferably, the substrate comprises a semiconductor substrate or a PCB board.

In view of the above, the winding of the present invention has the following benefits of a symmetric trace, a high Q-factor value, a small size, and a reduced inter-layer parasitic coupling capacitance.

BRIEF DESCRIPTION OF THE DRAWINGS

FIG. 10b is the equivalent electrical circuit of the transformer shown in FIG. 10a.

FIG. 11b is the equivalent electrical circuit of the transformer shown in FIG. 11a.

Figure 1:
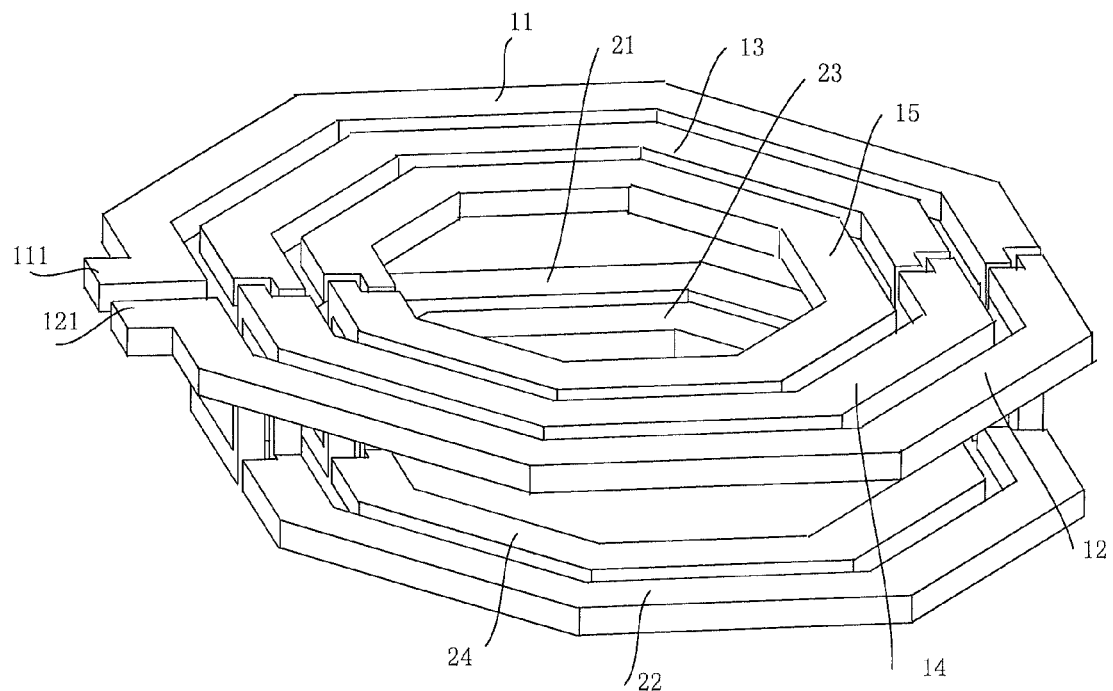
FIG. 1 is a schematic view of a preferred two-layer winding used for making an inductor consistent with the present invention.

REFERENCE SIGNS 11, 12, 13 half loop
14, 21, 22 half loop
23, 24 half loop
15 conductive loop
111, 121 terminal electrodes Detailed Description of the Preferred Embodiments The implementations of the present invention are illustrated through specific embodiments, and persons skilled in the art may easily understand other advantages and efficacies of the present invention through the content disclosed in the specification.

Referring from FIG. 1 to FIG. 13, it should be noted that, the structures, the scales, the sizes, like shown in the drawings, are only used to match the content disclosed in the specification, for being understood and read by persons skilled in the art, instead of limiting limited implementation conditions of the present invention, and thus not having any essential technical meaning. Any modification in structure, change in scale, or adjustment in size should fall within the scope of the technical content disclosed by the present invention without influencing the generated efficacy and achieved objective of the present invention. Meanwhile, some words such as "upper", "lower", "left", "right", "middle", and "a" quoted in the specification are only used for clarity of the illustration, instead of limiting the implementation scope of the present invention, and any changes or adjustments of relative relationships should be considered as falling within the scope of implementation of the present invention without essentially changing the technical content.

A winding provided in the present invention includes a plurality of layers, each layer includes at least one conductive loop; the conductive loops are electrically connected to form a winding; and the geometric center of a conductive loop or a loop section of at least one layer is not spatially aligned with the geometric center of a conductive loop or a loop section of at least one adjacent layer. The winding of the present invention may be used for making any inductive device, preferably used for making an inductor or a transformer, and illustrations are presented respectively such as some examples of winding of inductor and winding of transformer.

Embodiment 1:

As shown in FIG. 1, the winding includes 2 layers; the upper layer has 3 conductive loops; the 3 conductive loops have the same shape but different sizes, and are in a nested manner; the lower layer has 2 conductive loops, the 2 conductive loops have the same shape but different sizes, and are in a nested manner as well; the conductive loops are all regular and octagonal in shape, the spacings between two adjacent conductive loops of a same layer are the same for the two adjacent layers, but the geometric center of a conductive loop of the lower layer is not spatially aligned with the center of one conductive loop of the upper layer (that is, the orthogonal projection of the geometric center of one lower layer's conductive loop to the upper layer is not coinciding with the geometric center of one upper layer's conductive loop), and the distance between the orthogonal projection of the geometric center of one lower layer's conductive loop to the upper layer and the geometric center of one upper layer's conductive loop is 0.5×(W1+S1), where, W1 is the width of a single conductive loop, and S1 is the spacing between two conductive loops of the same layer.

In the 5 conductive loops, except for the conductive loop that includes a center tap (that is, an inner conductive loop 15 of the upper layer), other 4 conductive loops are each divided into 2 half loops, that is to say, in the upper layer, an outer conductive loop is divided into half loops 11 and 12, a middle conductive loop is divided into half loops 13 and 14, and the inner conductive loop 15 has an opening at the left side, i.e., a part of loop is not in face-to-face with another part of loop, and has two connection points; in the lower layer, an outer conductive loop is divided into half loops 21 and 22, and an inner conductive loop is divided into half loops 23 and 24. Preferably, each conductive loop is divided into 2 symmetric half loops along an axis of symmetry.

Each half loop is electrically connected to the half loop of another layer through pair of crossover conductive via plugs, so as to form 1 winding.

Preferably, two symmetric half loops of one layer are electrically connected to two symmetric half loops of another layer through a pair of crossover conductive via plugs, and therefore, five conductive loops are connected in series through 4 pairs of cross-over conductive via plugs so as to form a winding. In other words, two terminal points at the right side of the half loops 11 and 12 are electrically connected to two terminal points at the right side of the half loops 21 and 22 through 1 pair of crossover conductive via plugs; two terminal points at the right side of the half loops 13 and 14 are electrically connected to two terminal points at the right side of the half loops 23 and 24 through 1 pair of crossover conductive via plugs; two terminal points at the left side of the half loops 13 and 14 are electrically connected to two terminal points at the left side of the half loops 21 and 22 through 1 pair of crossover conductive via plugs; two terminal points of the conductive loop 15 are electrically connected to two terminal points at the left side of the half loops 23 and 24 through 1 pair of crossover conductive via plugs; therefore, electrical currents accessed from a terminal electrode 111 flows through the half loop 11 through the pair of crossover conductive via plugs and reaches the half loop 22 of the lower layer, and flows through the pair of crossover conductive via plugs and reaches the half loop 13 of the upper layer, then flows sequentially through the half loops 24, 15, 23, 14, 21, 12, and flows out through a terminal electrode 121. The winding may be used for making an inductor and the like.

Figure 2A:
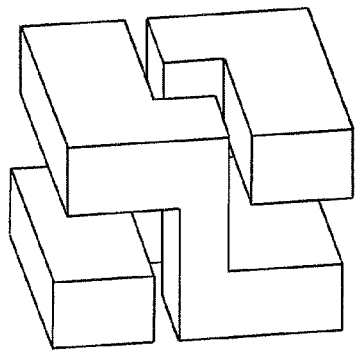
FIGS. 2a and 2b are schematic views of pairs of crossover conductive via plugs consistent with the present invention.
Figure 2B:
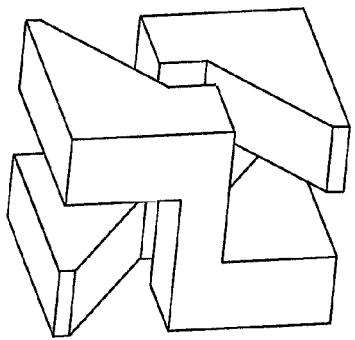

In this preferable embodiment, the width of a pair of crossover conductive via plugs does not exceed the width of a conductive loop. The structures of two preferable pairs of crossover conductive via plugs are shown in FIGS. 2a and 2b.

It should be noted that, because the number of the conductive loops is an odd number, the center tap is located in an inner loop of the top layer, and is opposite to the terminal electrode; if the number of the conductive loops is an even number, the center tap is located in an inner loop of the bottom layer, and is at the same side with the terminal electrode.

Embodiment 2

Figure 3:
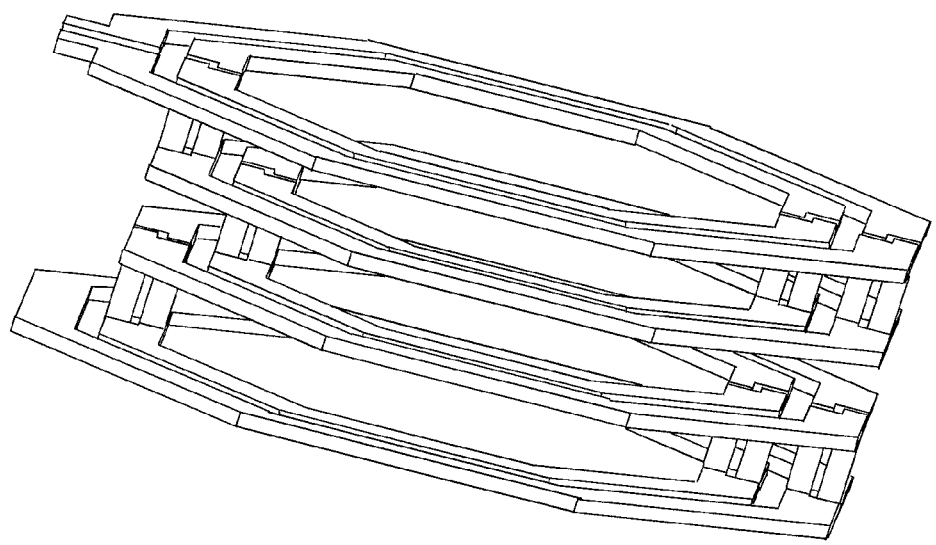
FIG. 3 is a schematic view of another preferred four-layer winding used for making an inductor consistent with the present invention.

As shown in FIG. 3, the winding includes 4 layers; each layer has 2 regular octagonal conductive loops having different sizes; the spacing between two adjacent conductive loops of a same layer is the same for the two layers. It could be seen in FIG. 3 that the geometric center of a conductive loop of the first layer, that is the top layer, is not spatially aligned with the geometric center of a conductive loop located in the second layer (that is, the orthogonal projection of the geometric center of one first layer's conductive loop to the second layer is not coinciding with the geometric center of one second layer's conductive loop) and the distance between the orthogonal projection of the geometric center of one first layer's conductive loop to the second layer and the geometric center of one second layer's conductive loop is preferably not more than $0.5 \times (W2+S2)$. The distance between the orthogonal projection of the geometric center of the fourth layer's conductive loop, that is the bottom layer, to the third layer and the center of one third layer's conductive loop is $0.5 \times (W2+S2)$, where, $W2$ is the width of a single conductive loop, and $S2$ is the spacing between two adjacent conductive loops of a same layer, which are in a nested manner.

Each conductive loop in the winding is divided into 2 half loops along its respective symmetry axis of each conductive loop, and each half loop is electrically connected to a corresponding half loop of another layer through a pair of crossover conductive via plugs, so as to form a winding. The terminal electrodes are symmetrically adjacent and located in two half loops of the outer conductive loop of the top layer and a center tap is located in the outer loop of the fourth layer. The winding may be used for making an inductor and the like.

Embodiment 3

Figure 4:
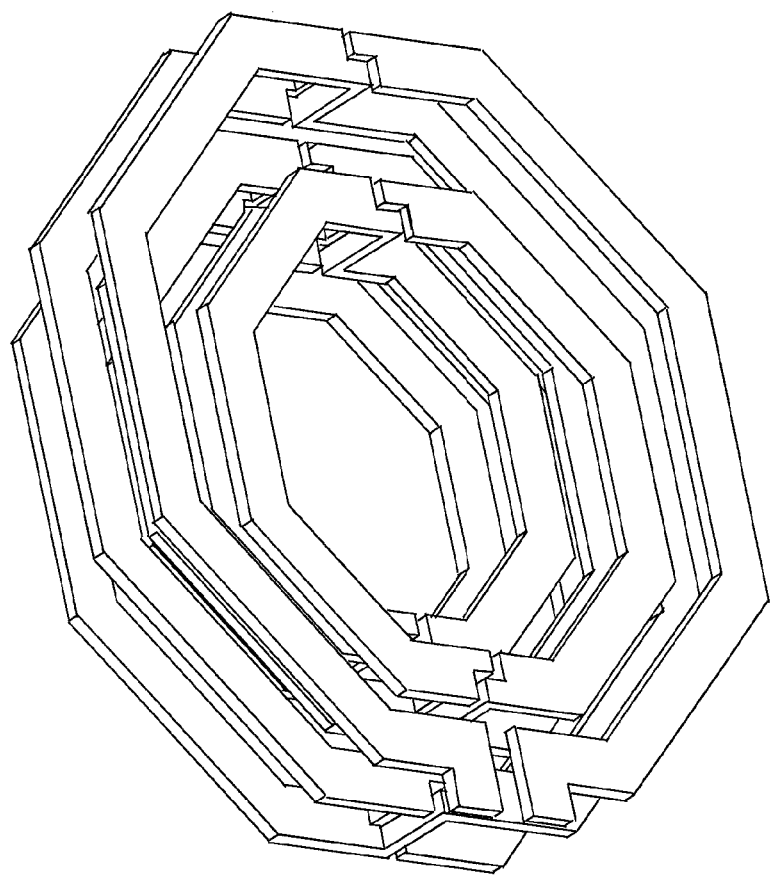
FIG. 4 is a schematic view of still another preferred three-layer winding used for making an inductor consistent with the present invention.

As shown in FIG. 4, the winding includes 3 layers, each of the top and bottom layers has 2 regular octagonal conductive loops, the middle layer has 3 regular octagonal conductive loops, the geometric center of a conductive loop located in the top layer is not spatially aligned with the geometric center of a conductive loop located in the middle layer (that is, the orthogonal projection of the geometric center of one top layer's conductive loop to the middle layer is not coinciding with the geometric center of one middle layer's conductive loop), and meanwhile, the geometric center of a conductive loop located in the bottom layer is not spatially aligned with the geometric center of a conductive loop located in the middle layer (that is, the orthogonal projection of the geometric center of one bottom layer's conductive loop to the middle layer is not coinciding with the geometric center of one middle layer's conductive loop). The distance between the geometric center of the inner conductive loop located in the top layer and the geometric center of one outer conductive loop located in the top layer does not exceed $0.5 \times (W3+S3)$, where, $W3$ is the width of a single conductive loop, and $S3$ is the minimum spacing between two adjacent conductive loops of the same layer, which are in a nested manner.

Each conductive loop in the winding is divided into 2 half loops along its respective symmetry axis of each conductive loop, and each half loop is electrically connected to a corresponding half loop of another layer through a pair of crossover conductive via plugs, so as to form a winding. The terminal electrodes are symmetrically adjacent and located in two half loops of the outer conductive loop of the top layer and a center tap is located in the inner loop of the bottom layer. The winding may be used for making an inductor and the like.

Embodiment 4

Figure 5:
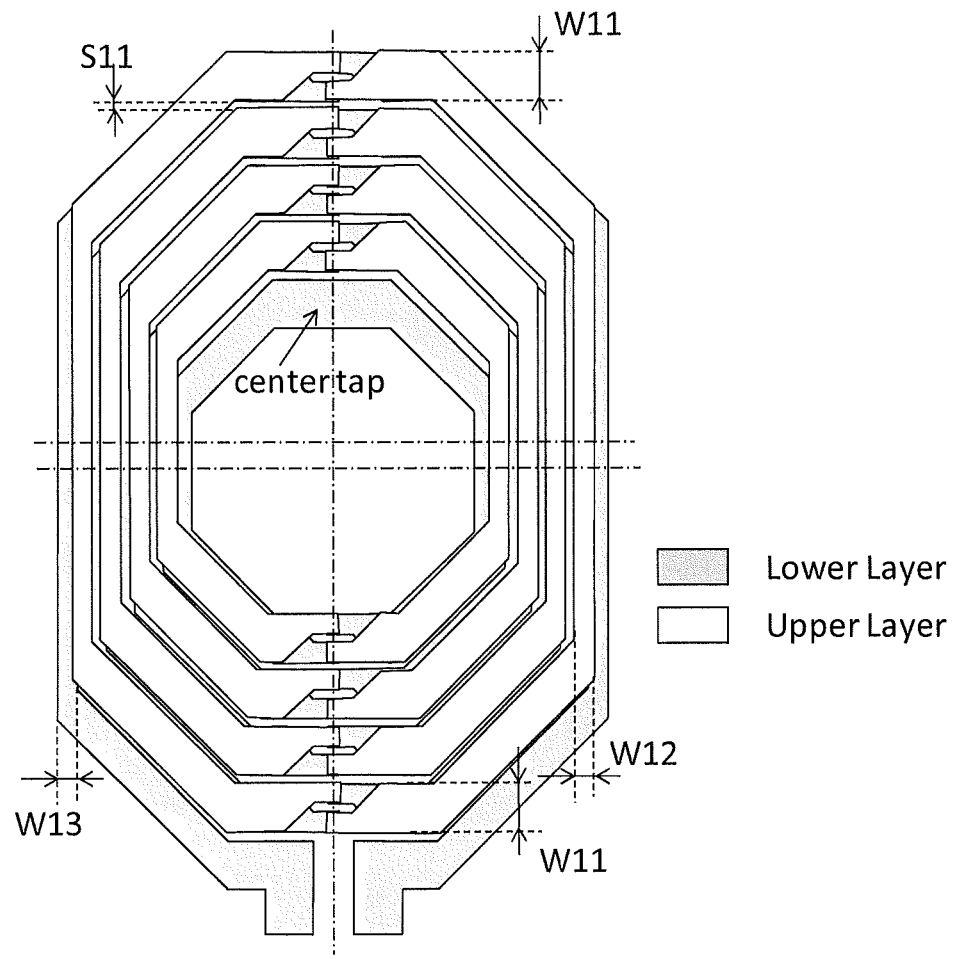
FIG. 5 is a schematic view of a preferred winding used for making an inductor, which the width is not uniform along one loop consistent with the present invention.

As shown in FIG. 5, the winding includes 2 layers, that is the upper layer and the lower layer; the upper layer has 4 conductive loops and the lower layer has 5 conductive loops. The width of a conductive loop section in the upper layer is $W11$ and the width of another section of the conductive loop located in the upper layer is $W12$; the width of a conductive loop section in the lower layer is $W11$ and the width of another section of the conductive loop located in the lower layer is $W13$. The distance between the orthogonal projection of the geometric center of one upper layer's conductive loop to the lower layer and the geometric center of one lower layer's conductive loop is $0.5 \times (W11+S11)$, where, $S11$ is the spacing between two adjacent conductive loops of the same layer.

Each conductive loop in the winding is divided into 2 half loops along its respective symmetry axis of each conductive loop, and each half loop is electrically connected to a corresponding half loop of another layer through a pair of crossover conductive via plugs, so as to form a winding. The terminal electrodes are symmetrically adjacent and located in two half loops of the outer conductive loop of the lower layer and a center tap is located in an inner loop of the lower layer. The winding may be used for making an inductor and the like.

It should be noted that, based on the description of this embodiment, persons skilled in the art should understand that this embodiment is only an example instead of limiting the present invention. In fact, the shape of the conductive loop may be other shapes, such as a shape having at least one axis of symmetry; in addition, the number of layers of the conductive loop is not limited to 2 or 4, and other numbers, such as 3, are also available.

It can be seen from the embodiments that the winding used as the inductor according to the present invention has the following advantages:

i. By means of the conductive loops having a symmetric structure, preferably regular or quasi-regular octagonal conductive loops, the quality factor (that is, the Q-factor) of the inductor may be improved.

ii. By means of interconnections through pairs of crossover conductive via plugs, the size of the winding can be reduced, thereby facilitating area consumption on the integration substrate.

iii. The shape of the conductive loop is geometrically symmetric, and a differential signal accessed from the terminal electrodes changes of conductive layer symmetrically every half turn, thereby the differential signal are kept in balance with the reference ground. This symmetry property of the differential signal in electronic circuits has the effect of not degrading some figures of merit of electronic circuits, and is thus very desirable.

iv. The (geometric centers of the) conductive loops of the different layers are not completely aligned spatially, i.e., the distance between the orthogonal projection of the geometric center of one layer's conductive loop to its adjacent layer and the geometric center of one loop of the same adjacent layer is $0.5 \times (W+S)$, that leads to increase the separation distance between a portion of conductive loop with another portion of loop, so that parasitic coupling capacitance between the conductive loops is effectively reduced, thereby enhancing the self-resonant frequency.

Therefore, based on the description of the embodiments, persons skilled in the art should understand that the above descriptions are only examples instead of limiting the present invention. In fact, any windings having the following features are included in the scope of the present invention:

a winding having a plurality of layers, each layer having at least one conductive loop, the conductive loops being in a nested manner and electrically connected to form a winding, except for the conductive loop that includes a center tap, the other conductive loops are respectively divided into 2N loop sections along its respective symmetry axis of each conductive loop, and each loop section is electrically connected to a corresponding loop section of another layer through a pair of crossover conductive via plugs, so as to form N windings, wherein N is an integer greater than or equal to 1; and the geometric center of a conductive loop or a loop section of at least one layer is not spatially aligned with the geometric center of a conductive loop or a loop section of at least one of its adjacent layer; the distance between the orthogonal projection of the geometric center of one layer's conductive loop to its adjacent layer and the geometric center of one loop of the same adjacent layer is 0.5×(W+S), where W is the width of a single conductive loop, and S is the spacing between two adjacent conductive loops which are in a nested manner of the same layer.

Embodiment 5

Figure 7:
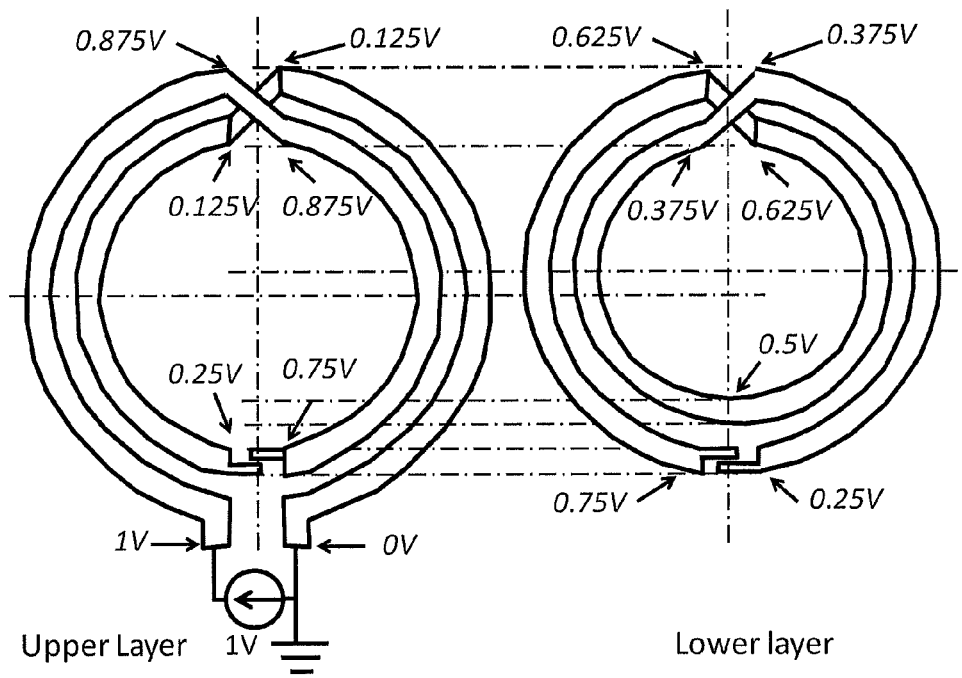
FIG. 7 is a schematic view of another preferred winding connected through cross bridges and a pair of crossover conductive via plugs and used for making an inductor.

As shown in FIG. 7, the winding includes 2 conductive layers, a lower layer and an upper layer; each of the layers has 2 conductive loops, the distance between the orthogonal projection of one upper layer's conductive loop center to the lower layer and the center of one conductive loop of the lower layer is 0.5×(W4+S4), where W4 is the width of the conductive loop, S4 is the spacing between two adjacent conductive loops which are in a nested manner of the same layer. The upper part of two conductive loops of the upper layer are electrically connected through a cross bridge; the upper part of two conductive loops of the lower layer are also electrically connected through a cross bridge. The inner conductive loop of the upper layer is electrically connected with the outer conductive loop of the lower layer through a pair of crossover conductive via plugs. The center tap is located in the inner loop of the lower layer, thus forming a winding, which could be used for making an inductor and the like.

Figure 6:
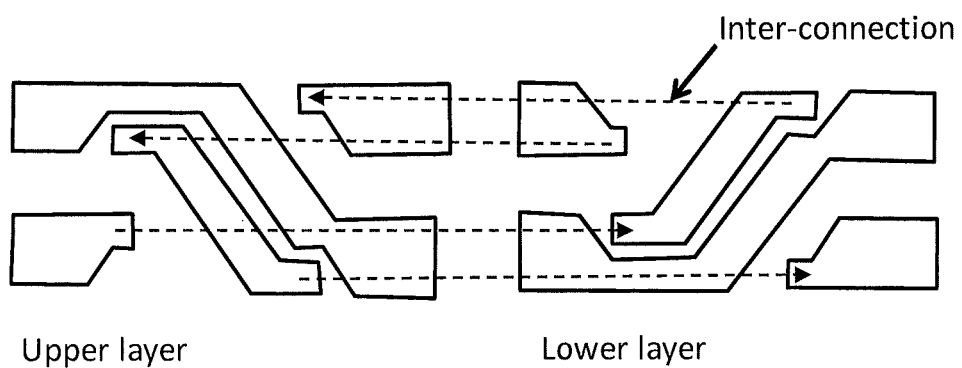
FIG. 6 is a schematic view of the cross bridge adopted in the winding of FIG. 7.

Preferably, the cross bridge has the same structure as shown in FIG. 6.

Embodiment 6

Figure 8:
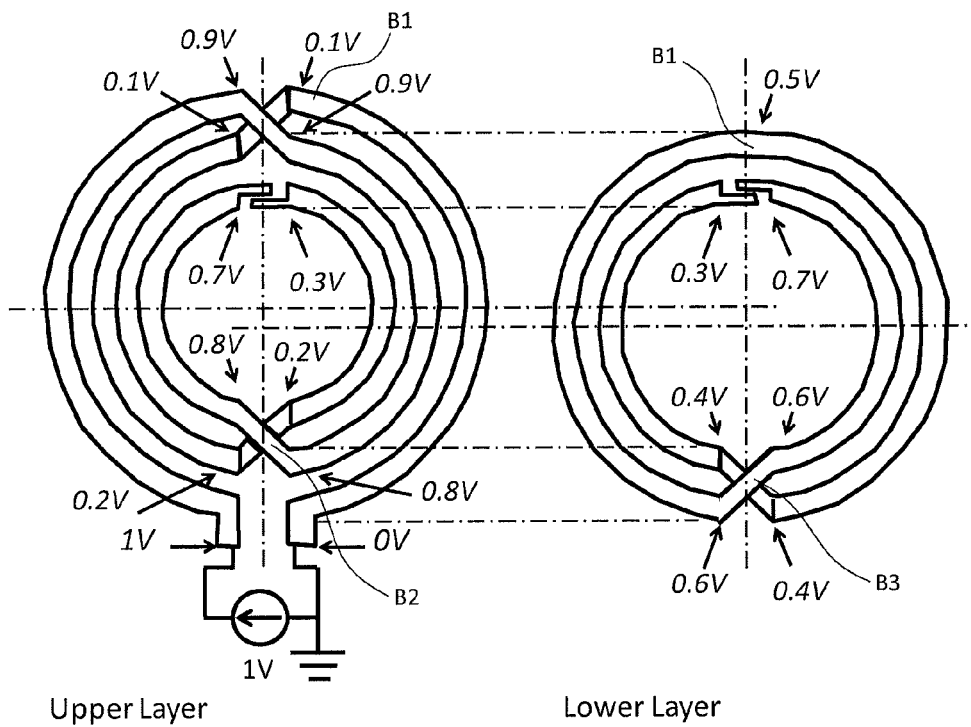
FIG. 8 is a schematic view of another preferred winding connected through cross bridges and a pair of crossover conductive via plugs and used for making an inductor.

As shown in FIG. 8, the winding includes 2 conductive layers; the upper layer has 3 conductive loops and the lower layer has 2 conductive loops. The distance between the orthogonal projection of the geometric center of one upper layer's conductive loop to the lower layer and the geometric center of one lower layer's conductive loop is 0.5×(W5+S5), where, W5 is the width of a single conductive loop, S5 is the spacing between two adjacent conductive loops which are in a nested manner of the same layer. The outer loop of the upper layer is electrically connected with the middle loop through a cross bridge B1, the middle loop of the upper layer is electrically connected with the inner loop through a cross bridge B2. The lower part of two conductive loops of the lower layer are electrically connected through a cross bridge B3. The inner loop of the upper layer is electrically connected with the inner loop of the lower layer through a pair of crossover conductive via plugs. The center tap is located in the outer loop of the lower layer, thus forming a winding, which could be used for making an inductor and the like.

Figure 9A:
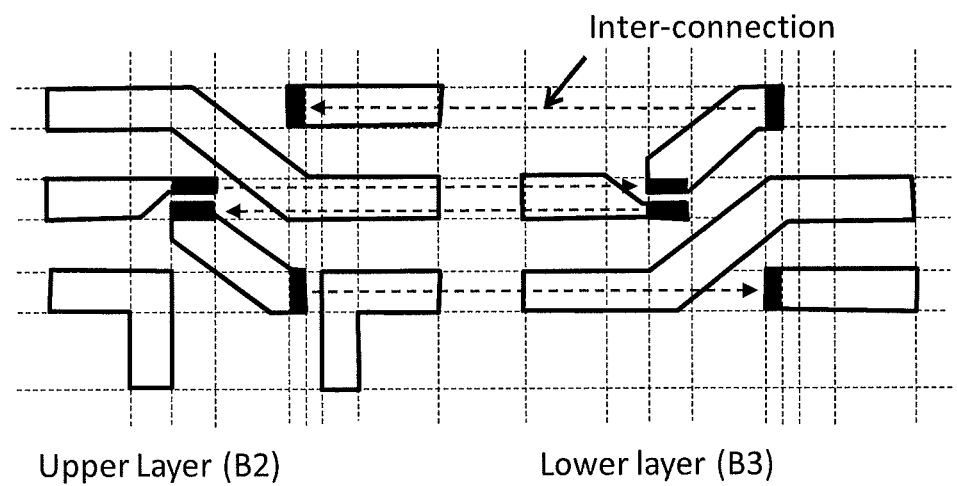
FIGS. 9a and 9b are schematic views of the cross bridge adopted in the winding of FIG. 10.
Figure 9B:
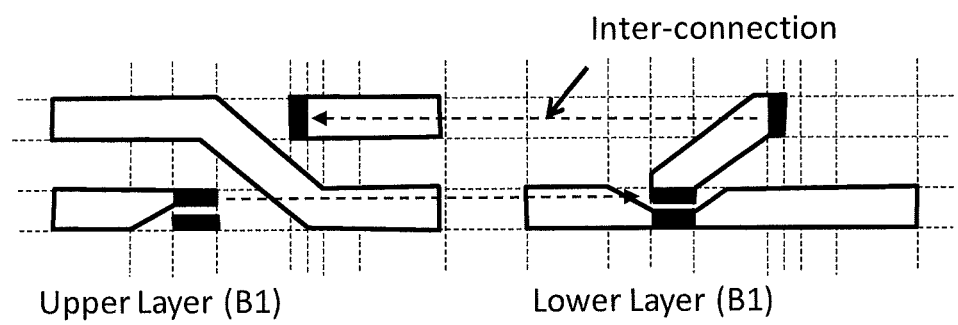

Preferably, the structures of the cross bridges B2 and B3 are shown in FIG. 9a, the structure of the cross bridge B1 is shown in FIG. 9b.

Preferably, the pair of crossover conductive via plugs has the same structure as shown in FIG. 2a or 2b.

Therefore, based on the description of the embodiments, those skilled in the art should understand that the above descriptions are only examples instead of limiting the present invention. In fact, any winding having the following features is included in the scope of the present invention:

a winding has a plurality of layers; each layer having at least one conductive loop; the conductive loops are in a nested manner; the conductive loops of the same layer are electrically connected through cross bridges; the conductive loops of different layers are electrically connected through a pair of crossover conductive via plugs; in two adjacent layers which are not spatially aligned, the distance between the orthogonal projection of one layer's conductive loop center to its adjacent layer and the center of one loop of the same adjacent layer does not exceed 0.5×(W+S), where W is the width of a single conductive loop, and S is the spacing between two adjacent conductive loops which are in a nested manner of the same layer.

Embodiment 7

Figure 10A:
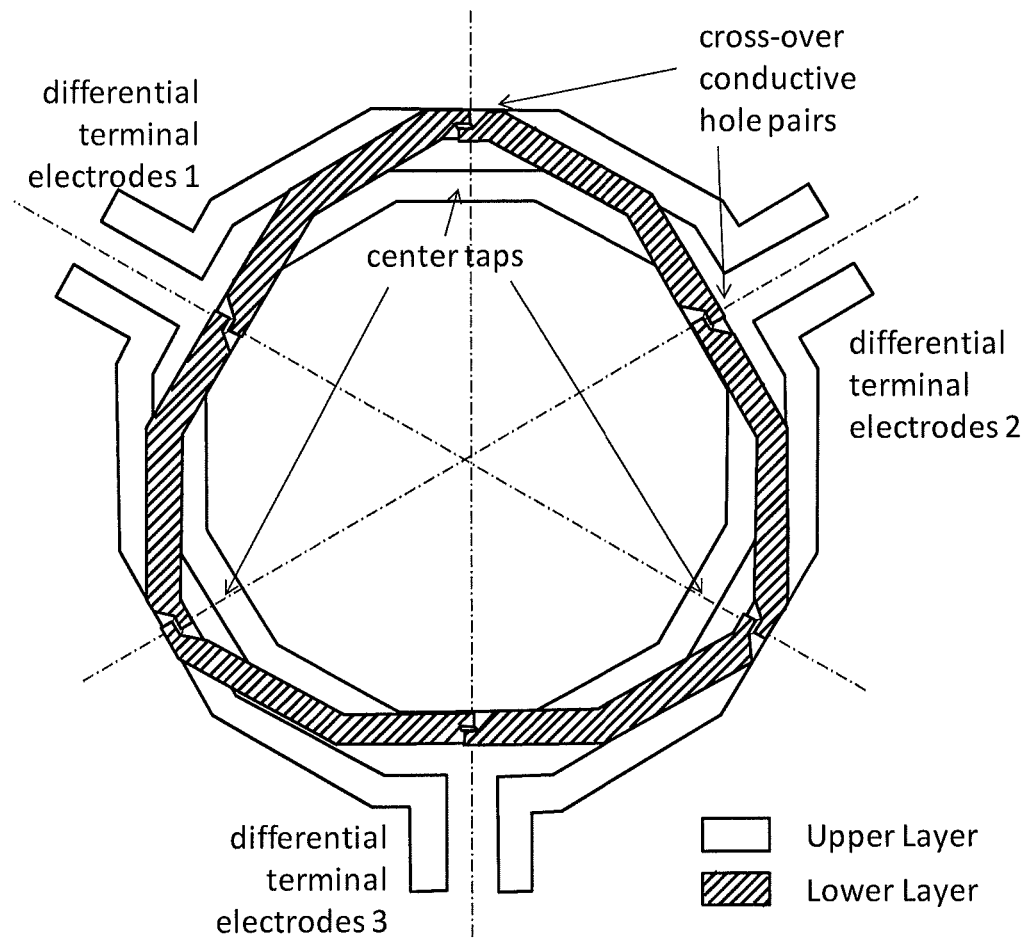
FIG. 10a is a schematic view of winding used for making a transformer having 3 windings consistent with the present invention.
Figure 10B:
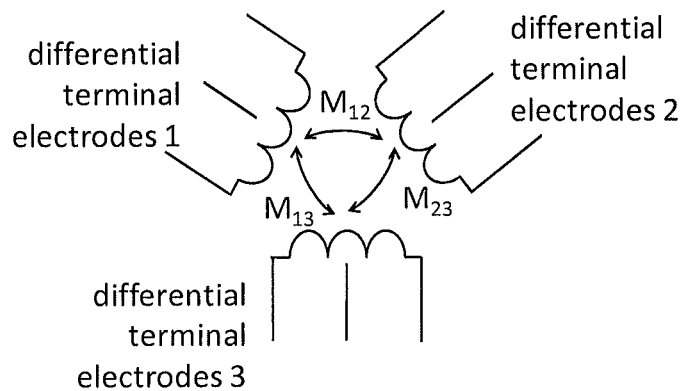

As shown in FIG. 10a, the winding comprises 2 conductive layers; the upper layer includes 2 regular octagonal conductive loops, and the lower layer includes 1 geometrically and symmetrically shaped conductive loop.

Except for an inner conductive loop of the upper layer, the 2 other conductive loops are both equally divided into 6 loop sections; each loop section is connected to another loop section of another layer through a pair of crossover conductive via plugs, and therefore, the 3 conductive loops are electrically connected to form 3 windings having a turns ratio of 1:1:1. Moreover, the geometric center of a one-third loop of the upper layer and of one winding is not spatially aligned with the geometric center of another one-third loop of the lower layer and of the same winding along an axis of symmetry.

Two terminal electrodes of each of the 3 windings are located in an outer conductive loop of the upper layer, are adjacent and located symmetrically in two adjacent loop sections. Moreover, each center taps corresponding to each winding are located in the inner conductive loop of the upper layer.

Obviously, in each winding, electrical currents accessed from the terminal electrode flows through every one-sixth conductive loops alternately from one layer to another layer. The winding could be used for making a transformer and the like.

Embodiment 8

Figure 11A:
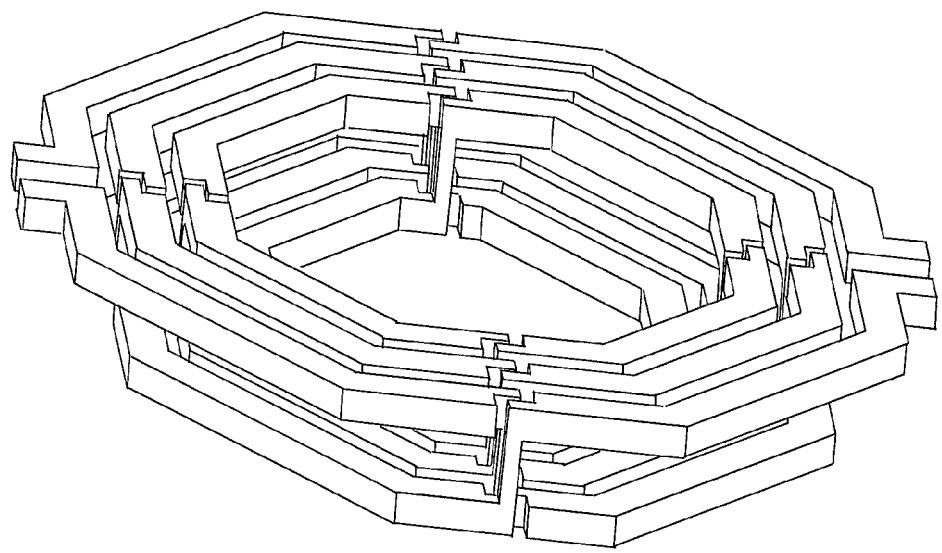
FIG. 11a is a schematic view of winding used for making a transformer having 2 windings consistent with the present invention.
Figure 11B:
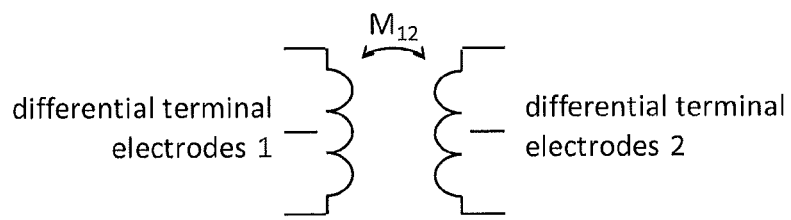

As shown in FIG. 11a, the winding comprises 2 conductive layers; each layer includes 3 octagonal conductive loops.

Except for an inner conductive loop of the lower layer, the 5 other conductive loops are each equally divided into 4 loop sections; each loop section is connected to another loop section located in another layer through a pair of crossover conductive via plugs, so as to form 2 windings having a turns ratio of 1:1; and the terminal electrodes of the 2 windings are all located in an outer conductive loop of the upper layer. Obviously, in each winding, electrical currents accessed from the terminal electrode flows through every one-fourth conductive loops alternately from one layer to another layer. Moreover, in the half loops of the same winding, the orthogonal projection of the center of a half loop located in the upper layer to the lower layer is not spatially aligned with the center of a half loop located in the lower layer; and the distance between the orthogonal projection of the center of a half loop located in the upper layer to the lower layer and the geometric center of a half loop located in the lower layer is 0.5×(W6+ S6), where W6 is the width of a single conductive loop, and S6 is the spacing between two adjacent conductive loops of the same layer.

It can be seen from the embodiments that the winding used as the transformer according to the present invention has the following advantages:

i. By sharing the same area, the intermingled loop sections constituting one winding overlap spatially with the other winding, thereby effectively improving the magnetic coupling between the windings.

ii. Each conductive loop has a plurality of axes of symmetry, and is preferably based on an octagonal shape, thereby effectively improving the Q-factor value of each winding.

iii. The pairs of crossover conductive via plugs are used to connect the conductive loops of different layers, so that the surface area occupied by the winding on the integration substrate can be effectively reduced.

iv. The shape of each winding is geometrically symmetric, and electrical currents accessed from each terminal electrode flows through one loop section to another loop section alternately from one layer to another layer, thereby the electrical differential signals coming from the terminal electrodes are kept in balance, and it results to an ideal reciprocal port network device.

Based on the above descriptions, the winding may be prepared on a semiconductor substrate by using a semiconductor process, at least one inter-conductive dielectric layers is disposed between each two conductive layers, and a dielectric material is filled between conductive loops on each layer so that the conductive loops are electrically isolated from one another. Moreover, the winding may also be formed on a PCB board by using a PCB process, and conductive loops are isolated from one another through a dielectric material.

Preferably, during the preparation, if the sheet resistance of a certain conductive layer is different than that of another layer, the layer having the lowest sheet resistance is used for forming the winding including the highest number of conductive loops.

The advantages of the present invention are detailed through the analysis on the parasitic coupling capacitance of the conductive loops as shown in FIGS. 7 and 8 according to the circuit theory with reference to the FIGS. 7 and 8 as follows.

Figure 12:
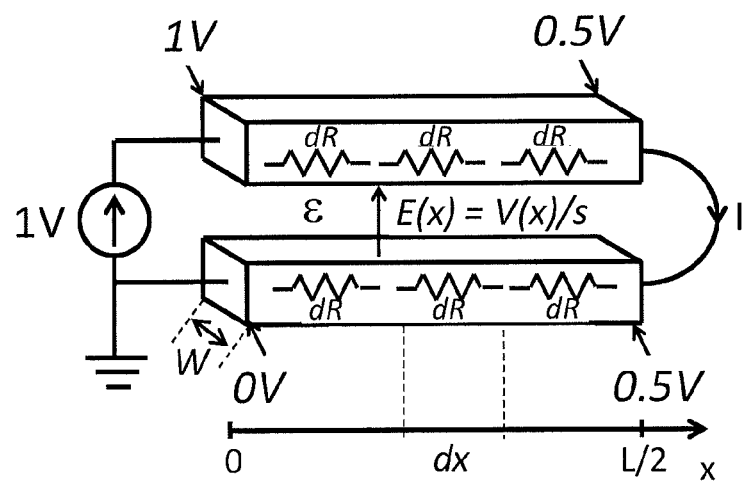
FIG. 12 is a schematic view illustrating the electric storage of two adjacent lines electrically connected in series.

As shown in FIG. 12, assume two ideal, uniform and conductive lines set in face-to-face and shorted at the right extremity which the two lines are separated by an insulating material of thickness s and dielectric constant ε and the length of each line is L/2. The width of the each line is W. Assume that the lines are purely resistive and the distribution of the resistance is uniform along the lines. This results to the linear distribution of the potential along the line. At the left side, the differential voltage between the lines is 1V whereas at the right side, the differential voltage is 0V. The differential voltage across the two lines V(x) as function of the position x can be expressed as following:

$$V(x) = \left( -\frac{2 \cdot x}{L} + 1 \right) \quad (1)$$

Neglecting the fringing capacitances, the capacitance value dC of a section of line dx can be expressed as following:

$$dC = \frac{\varepsilon \cdot W}{s} \cdot dx \quad (2)$$

The amount of electric energy stored by the lines $Ec_0$ can be expressed as the sum of the capacitances of all the sections and the differential voltage along the line:

$$Ec_0 = \frac{1}{2} \cdot C_{EQ0} \cdot V^2 = \frac{1}{2} \cdot \int_0^{L/2} dC \cdot V(x)^2 \quad (3)$$

or, $$Ec_0 = \frac{1}{2} \cdot \frac{\varepsilon \cdot W}{s} \cdot \frac{L}{6} \quad (4)$$

Then, the equivalent capacitance $C_{EQ0}$ seen at the input can be expressed as following:

$$C_{EQ0} = \frac{\varepsilon \cdot W}{s} \cdot \frac{L}{6} \sim 0.33 \cdot C_0 \quad (5)$$

where $C_0$ is the capacitance value corresponding to the parallel plate capacitance when the lines are opened at the right extremity:

$$C_0 = \frac{\varepsilon \cdot W}{s} \cdot \frac{L}{2} \quad (6)$$

Figure 13:
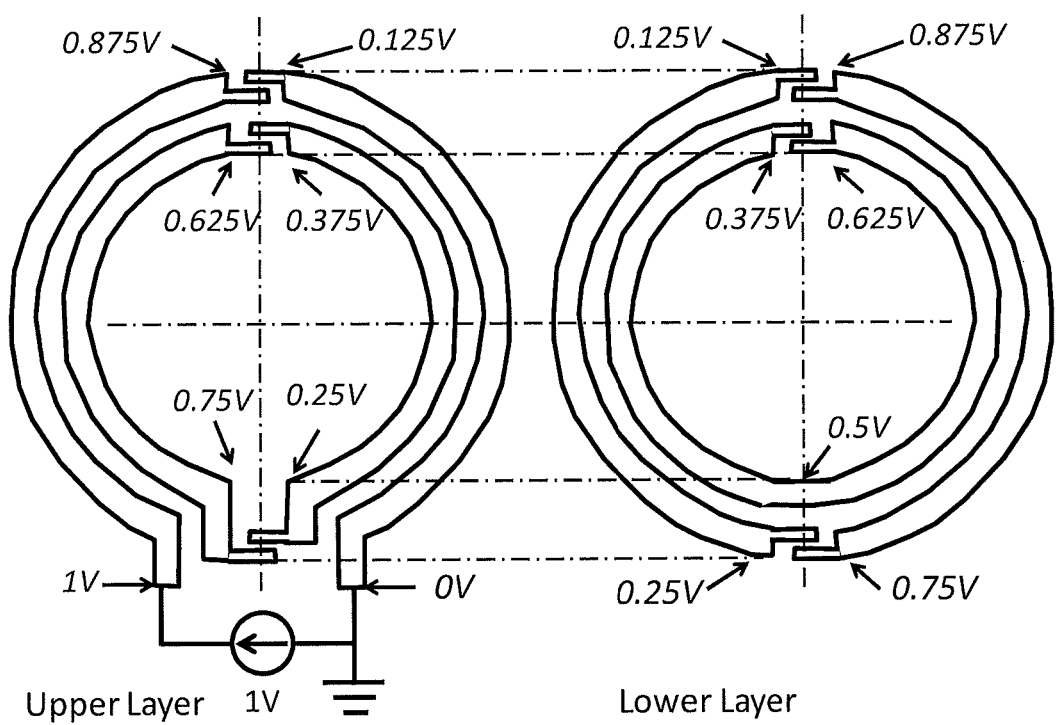
FIG. 13 is a schematic view of voltage distribution of stacked inductor which the loops in a layer are spatially aligned with the loops of another layer.

From above description, assume the inductor winding shown in FIG. 13 which the loops and the geometric centers of the loops located in the upper layer and the lower layer are spatially aligned. Assume at first approximation that the inner and the outer conductive loops have ideally the same length. When a voltage of 1V is applied to the inductor winding, the differential voltage between the outer conductive loop of the upper layer and the outer conductive loop of the lower layer is constant and is equal to 0.75V, and the differential voltage between the inner conductive loop of the upper layer and the inner conductive loop of the lower layer is constant and is equal to 0.25V.

The electric energy stored by the inductor winding and related to the two adjacent layers can be expressed as following (the electric energy stored by the loops in a nested manner is not considered because the separation distance can vary):

$$Ec_1 \sim \frac{1}{2} \cdot C_1 \cdot 0.75^2 + \frac{1}{2} \cdot C_1 \cdot 0.25^2 \quad (7)$$

$$C_1 = \frac{\varepsilon \cdot W}{s} \cdot \frac{L}{2} \quad (8)$$

where W is the loop width, L is the length of the unwound winding, s is the separation distance of the outer loop of the upper layer and the outer loop of the lower layer, which is also the distance between the inner loop of the upper layer and the inner loop of the lower layer. Therefore, the equivalent capacitance related to the coupling capacitance of the inductor can be expressed as following:

$$C_{EQ1} \sim 0.56 \cdot C_1 \quad (9)$$

Concerning the 4-loop winding shown in FIG. 7, the geometric center of conductive loop located in the upper layer is not spatially aligned with the geometric center of the conductive loop located in the lower layer, therefore, the differential voltage between a portion of outer conductive loop of the upper layer and a portion of outer conductive loop of the lower layer could be reduced until to 0.25V. Comparing with the structures which are spatially aligned as shown in FIG. 14, the coupling capacitance in the present embodiment could be obviously reduced, thus the self-resonance frequency ($f_{SR}$) as shown in the following could be obviously increased and the performances could be greatly improved.

$$f_{SR} = \frac{1}{2\pi\sqrt{L_S C_P}} \quad (10)$$

where $L_s$ is the inductance value of the inductor winding and $C_p$ is the total coupling capacitance that includes the capacitance related to the face-to-face loops and to the adjacent loops located in a same layer.

Similarly, concerning the winding shown in FIG. 8, the differential voltage between the corresponding loop portions of the upper layer and the lower layer could be reduced until to 0.2V. Comparing to a five-loop inductor winding which the loops and the centers of the upper layer and the lower layer are spatially aligned, the coupling capacitance could be obviously reduced.

Preferably, during the preparation, if the sheet resistance of a certain conductive layer is different than that of another layer, the layer having the lowest sheet resistance is used for forming the winding including the highest number of conductive loops.

In view of the above, by making the conductive loops of different layers being not aligned with each other, the winding of the present invention may implement disposition of one or more complete loops of each layer; moreover, the conductive loops of different layers are interconnected through the pairs of crossover conductive via plugs, so that the surface area on the integration substrate is effectively optimized and the parasitic coupling capacitance is reduced while acquiring the winding having a high Q-factor value. Therefore, the present invention effectively overcomes defects in the prior art and has high industrial utilization value.

The above descriptions of the detailed embodiments are only to illustrate the principle and the efficacy of the present invention, and it is not to limit the scope of the present invention. Any person skilled in the art can modify or change the embodiments without departing from the spirit and scope of the present invention. Accordingly, all equivalent modifications and variations completed by persons of ordinary skill in the art, without departing from the spirit and technical idea of the present invention, should fall within the scope of the present invention defined by the appended claims.

What is claimed is:

1. A winding comprising:
   a plurality of conductive layers, each of the conductive layers comprising at least one conductive loop, the conductive layers being electrically connected to form a winding,
   the conductive loop or a geometric center of the conductive loop of at least one layer is not spatially aligned with another conductive loop or a geometric center of the another conductive loop of at least one other conductive layer;
   wherein when a plurality of conductive loops are in a nested configuration within a conductive layer, in two adjacent conductive layers when the geometric centers of the conductive loops are not spatially aligned with each other, a distance between an orthogonal projection of the geometric center of a conductive loop of one layer to an adjacent layer, and the geometric center of one loop of the same adjacent layer is 0.5×(W+S), where W is the width of a single loop, and S is the spacing between two adjacent conductive loops which are in a nested configuration within the same layer.

2. The winding according to claim 1, wherein, except for the conductive loop that includes a center tap, other conductive loops are each divided into 2N loop sections, each loop section being electrically connected to a another loop section of another layer through a pair of crossover conductive via plugs, so as to form N windings, wherein N is an integer greater than or equal to 1.

3. The winding according to claim 1, wherein, except for the conductive loop that includes a center tap, other conductive loops are each divided into 2N loop sections, each loop section is electrically connected to a another loop section of another layer through a pair of crossover conductive via plugs, so as to form N windings, wherein N is an integer greater than or equal to 1.

4. The winding according to claim 1, wherein the width of a pair of crossover conductive via plugs does not exceed the width of a conductive loop.

5. The winding according to claim 2, wherein the width of a pair of crossover conductive via plugs does not exceed the width of a conductive loop.

6. The winding according to claim 3, wherein the width of a pair of crossover conductive via plugs does not exceed the width of a conductive loop.

7. The winding according claim 1, wherein the conductive loops of the same layer are electrically connected through cross bridges, the conductive loops are electrically connected to other loops located in a different layer through a pair of crossover conductive via plugs.

8. The winding according to claim 1, wherein terminal electrodes of each winding are symmetrically adjacent and located in two adjacent loop sections of the same conductive loop.

9. The winding according to claim 2, wherein terminal electrodes of each winding are symmetrically adjacent and located in two adjacent loop sections of the same conductive loop.

10. The winding according to claim 3, wherein terminal electrodes of each winding are symmetrically adjacent and located in two adjacent loop sections of the same conductive loop.

11. The winding according to claim 4, wherein terminal electrodes of each winding are symmetrically adjacent and located in two adjacent loop sections of the same conductive loop.

12. The winding according to claim 5, wherein terminal electrodes of each winding are symmetrically adjacent and located in two adjacent loop sections of the same conductive loop.

13. The winding according to claim 6, wherein terminal electrodes of each winding are symmetrically adjacent and located in two adjacent loop sections of the same conductive loop.

14. The winding according to claim 8, wherein terminal electrodes of the plurality of windings belong to the same conductive loop.

15. The winding according to claim 9, wherein terminal electrodes of the plurality of windings belong to the same conductive loop.

16. The winding according to claim 10, wherein terminal electrodes of the plurality of windings belong to the same conductive loop.

17. The winding according to claim 11, wherein terminal electrodes of the plurality of windings belong to the same conductive loop.

18. The winding according to claim 12, wherein terminal electrodes of the plurality of windings belong to the same conductive loop.

19. The winding according to claim 13, wherein terminal electrodes of the plurality of windings belong to the same conductive loop.

20. The winding according to claim 7, wherein the width of a pair of crossover conductive via plugs does not exceed the width of a conductive loop.

21. The winding according to claim 1, wherein the conductive loops are in a shape of regular polygon, oval, circle or simple closed curve.

22. The winding according to claim 1, wherein the widths of different loop sections in the same conductive loop are not completely uniform along the loop.

23. The preparation method of a winding as in claim 1, at least comprising:
    forming the winding on a substrate, wherein, conductive loops are isolated with one another through a dielectric material.

24. The preparation method of a winding as in claim 23, wherein the substrate comprises a semiconductor substrate or a PCB board.

* * * * *